United States Patent
Okada

[11] Patent Number: 5,952,431
[45] Date of Patent: Sep. 14, 1999

[54] PROCESS FOR PRODUCING ACID-MODIFIED POLYPHENYLENE ETHER AND POLYSTYRENIC RESIN COMPOSITION

[75] Inventor: Akihiko Okada, Ichihara, Japan

[73] Assignee: Idemitsu Petrochemical Co., Ltd., Tokyo, Japan

[21] Appl. No.: 08/765,443

[22] PCT Filed: May 15, 1996

[86] PCT No.: PCT/JP96/01277

§ 371 Date: Jan. 16, 1997

§ 102(e) Date: Jan. 16, 1997

[87] PCT Pub. No.: WO96/36658

PCT Pub. Date: Nov. 21, 1996

[30] Foreign Application Priority Data

May 16, 1995 [JP] Japan ................................. 7-116733

[51] Int. Cl.$^6$ .................................................. C08F 283/08
[52] U.S. Cl. ............................................. 525/391; 525/68
[58] Field of Search ................................ 525/386, 391, 525/68

[56] References Cited

U.S. PATENT DOCUMENTS

| | | |
|---|---|---|
| 4,684,669 | 8/1987 | Wroczynski . |
| 4,751,268 | 6/1988 | Taubitz ................................ 525/392 |
| 4,792,586 | 12/1988 | Han ..................................... 525/92 A |
| 4,814,393 | 3/1989 | Ishihara . |
| 4,889,889 | 12/1989 | Yates .................................... 525/66 |
| 4,957,965 | 9/1990 | Taubitz et al. . |
| 4,994,531 | 2/1991 | Brown ................................. 525/391 |
| 5,216,089 | 6/1993 | Gallucci .............................. 525/905 |
| 5,248,728 | 9/1993 | Lee ...................................... 525/92 B |
| 5,326,813 | 7/1994 | Okada et al. . |
| 5,352,727 | 10/1994 | Okada . |
| 5,412,024 | 5/1995 | Okada et al. . |
| 5,418,275 | 5/1995 | Okada et al. . |
| 5,436,397 | 7/1995 | Okada . |
| 5,444,126 | 8/1995 | Okada et al. . |
| 5,543,462 | 8/1996 | Okada et al. . |
| 5,777,021 | 7/1998 | Nakano ................................ 524/508 |

FOREIGN PATENT DOCUMENTS

| | | |
|---|---|---|
| 0 226 910 | 7/1987 | European Pat. Off. . |
| 0 257 486 | 3/1988 | European Pat. Off. . |
| 0 302 485 | 2/1989 | European Pat. Off. . |
| 0 546 497 | 6/1993 | European Pat. Off. . |

OTHER PUBLICATIONS

Patent Abstracts of Japan, vol. 014, No. 492 (C–0773), Oct. 26, 1990, JP 2–202 947, Aug. 13, 1990.

*Primary Examiner*—Paul R. Michl
*Attorney, Agent, or Firm*—Oblon, Spivak, McClelland, Maier & Neustadt, P.C.

[57] ABSTRACT

A process for producing an acid-modified polyphenylene ether comprising conducting modification reaction substantially in the absence of solvents at 300 to 350° C. by using (a) 100 parts by weight of a polyphenylene ether, (b) 0.1 to 5.0 parts by weight of fumaric acid or a derivative of fumaric acid, and optionally (c) 0.1 to 5.0 parts by weight of a radical generating agent having a half-life of 1 minute at a temperature of 300° C. or higher; and a polystyrenic resin composition comprising (d) 100 parts by weight of a styrenic polymer having the syndiotactic configuration or 100 parts by weight of a component composed of a styrenic polymer having the syndiotactic configuration and a rubbery elastomer and/or a polyamide, (e) 0.5 to 5.0 parts by weight of an acid-modified polyphenylene ether obtained by the above process, and optionally (f) 1 to 350 parts by weight of inorganic filler.

A convenient process for producing an acid-modified polyphenylene ether which does not cause deterioration of the working environment, enables stable production, and suppresses decrease in the molecular weight has been developed. A polystyrenic resin composition which can exhibit high toughness is provided by using the obtained acid-modified polyphenylene ether.

37 Claims, No Drawings

PROCESS FOR PRODUCING ACID-MODIFIED POLYPHENYLENE ETHER AND POLYSTYRENIC RESIN COMPOSITION

TECHNICAL FIELD

The present invention relates to a process for producing an acid-modified polyphenylene ether and a polystyrenic resin composition using the acid-modified polyphenylene ether obtained by the process. More particularly, the present invention relates to a convenient process for producing an acid-modified polyphenylene ether which does not cause deterioration of the working environment, enables stable production, and suppresses decrease in the molecular weight, and also to a syndiotactic polystyrenic resin composition which comprises the acid-modified polyphenylene ether produced by the above process and is advantageously molded to prepare industrial products, such as electric and electronic parts (connectors, printed boards, and the like), industrial structural materials, automotive parts (connectors for vehicles, wheel caps, cylinder head covers, and the like), electric appliances, various types of mechanical part, pipes, sheets, trays, films, and the like.

BACKGROUND ART

Heretofore, modification of polyphenylene ethers (hereinafter, occasionally referred to as PPO) by maleic anhydride has been conducted for the purpose of improving adhesion with inorganic fillers and compatibility with polar resins such as polyamides. As the process for the modification, the modification in a solution and the modification in a melt have been known.

As the modification in a solution, a technology in which styrene, a combination of styrene and maleic anhydride, or a polymerizable polar monomer is grafted on PPO in the presence of a radical generating agent has been known. However, formation of homopolymers and copolymers of the components which are intended to be grafted on PPO and formation of gel in PPO itself inevitably take place in this process. Therefore, when the modified PPO obtained by the process is used in composites and alloys, the composites and the alloys do not have sufficient mechanical properties, heat resistance, or stability. Particularly when the modified PPO is used in composites and alloys containing syndiotactic polystyrene (hereinafter, occasionally referred to as SPS) and the addition of the modified PPO in a small amount is expected to exhibit sufficient effect for improving compatibility with other resins and adhesion with inorganic fillers, the impurities described above cause problems. The use of a solvent causes another problem in that the process becomes complicated and increase in cost is inevitable.

As the modification in a melt, a process in which PPO and maleic anhydride or a derivative thereof are melt kneaded together in the presence of a radical generating agent has heretofore been known. However, PPO has a high melt viscosity, and the melt kneading is substantially possible at a temperature of 300° C. or higher. When the modification is conducted by using maleic anhydride which shows intense irritation and has a low boiling point, deterioration of the working environment caused by vaporization of maleic anhydride makes a great problem. Moreover, when the modification is conducted by using maleic anhydride, the molecular weight of PPO is significantly decreased to result in an insufficient melt viscosity of the modified PPO strands, and this causes a problem in the stability of the production. As another problem, when the obtained modified PPO is used in a composite or an alloy containing SPS, increase in the toughness of the resin composition is insufficient because of the low molecular weight of the modified PPO.

Under the above circumstances, the present invention has an object of developing a convenient process for producing an acid-modified PPO which does not cause deterioration of the working environment, enables stable production, and suppresses decrease in the molecular weight.

The present invention also has another object of providing a resin composition containing SPS which can exhibit a high toughness.

DISCLOSURE OF THE INVENTION

As the result of extensive studies undertaken by the present inventors, it was discovered that the above objects can be achieved by using, as the modifier, fumaric acid or a derivative thereof which shows no adverse effects to human body and is approved as an additive for foods. The present invention has been completed on the basis of the above discovery.

Accordingly, the present invention provides a process for producing an acid-modified polyphenylene ether comprising conducting modification reaction substantially in the absence of solvents at 300 to 350° C. by using (a) 100 parts by weight of a polyphenylene ether, (b) 0.1 to 5.0 parts by weight of fumaric acid or a derivative of fumaric acid, and optionally (c) 0.1 to 5.0 parts by weight of a radical generating agent having a half-life of 1 minute at a temperature of 300° C. or higher.

The present invention also provides polystyrenic resin compositions, including:

Firstly, a polystyrenic resin composition comprising (d) 100 parts by weight of a styrenic polymer having the syndiotactic configuration, (e) 0.5 to 5.0 parts by weight of the acid-modified polyphenylene ether obtained by the process described above, and (f) 0.5 to 350 parts by weight of inorganic filler;

Secondly, a polystyrenic resin composition comprising 100 parts by weight of a component composed of (d) 50.0 to 97.0% by weight of a styrenic resin having the syndiotactic configuration and (d') 3.0 to 50.0% by weight of a rubbery elastomer, (e) 0.5 to 5.0 parts by weight of the acid-modified polyphenylene ether obtained by the process described above, and (f) 1 to 350 parts by weight of inorganic filler;

Thirdly, a polystyrenic resin composition comprising 100 parts by weight of a component composed of (d) 10.0 to 90.0% by weight of a styrenic resin having the syndiotactic configuration and (d") 10.0 to 90.0% by weight of a polyamide, and (e) 0.5 to 10.0 parts by weight of the acid-modified polyphenylene ether obtained by the process described above;

Fourthly, a Polystyrenic resin composition comprising 100 parts by weight of a component composed of (d) 9.0 to 90.0% by weight of a styrenic resin having the syndiotactic configuration, (d') 1.0 to 50.0% by weight of a rubbery elastomer, and (d") 9.0 to 90.0% by weight of a polyamide and (e) 0.5 to 10.0 parts by weight of the acid-modified polyphenylene ether obtained by the process described above;

Fifthly, a polystyrenic resin composition comprising 100 parts by weight of a component composed of (d) 10.0 to 90.0% by weight of a styrenic resin having the syndiotactic configuration and (d") 10.0 to 90.0% by weight of a polyamide, (e) 0.5 to 10.0 parts by weight of the acid-modified polyphenylene ether obtained by the process described above, and (f) 1 to 350 parts by weight of inorganic filler; and Sixthly, a polystyrenic resin composition comprising 100 parts by weight of a component composed of (d) 9.0 to 90.0% by weight of a styrenic resin having the syndiotactic configuration, (d') 1.0 to 50.0% by weight of a rubbery elastomer, and (d") 9.0 to 90.0% by weight of a polyamide, (e) 0.5 to 10.0 parts by weight of the acid-modified polyphenylene ether obtained by the process described above, and (f) 1 to 350 parts by weight of inorganic filler.

THE MOST PREFERRED EMBODIMENT TO CARRY OUT THE INVENTION

The process for producing an acid-modified polyphenylene ether of the present invention is described in detail. The polyphenylene ethers used for the modification are known compounds, and the specifications of U.S. Pat. Nos. 3,306,874, 3,306,875, 3,257,357, and 3,257,358 can be referred to for this purpose. Polyphenylene ethers can generally be produced by the oxidative coupling reaction forming homopolymers or copolymers in the presence of a copper-amine complex and one or more types of phenol which are substituted at two or three positions. As the copper-amine complex, a copper-amine complex derived from a primary, secondary, or tertiary amine can be used. Examples of the suitable polyphenylene ether include poly (2,3-dimethyl-6-ethyl-1,4-phenylene ether), poly(2-methyl-6-chloromethyl-1,4-phenylene ether), poly(2-methyl-6-hydroxyethyl-1,4-phenylene ether), poly(2-methyl-6-n-butyl-1,4-phenylene ether), poly(2-ethyl-6-isopropyl-1,4-phenylene ether), poly(2-ethyl-6-n-propyl-1,4-phenylene ether), poly(2,3,6-trimethyl-1,4-phenylene ether), poly[2-(4'-methylphenyl)-1,4-phenylene ether], poly(2-bromo-6-phenyl-1,4-phenylene ether), poly(2-methyl-6-phenyl-1,4-phenylene ether), poly(2-phenyl-1,4-phenylene ether), poly (2-chloro-1,4-phenylene ether), poly(2-methyl-1,4-phenylene ether), poly(2-chloro-6-ethyl-1,4-phenylene ether), poly(2-chloro-6-bromo-1,4-phenylene ether), poly(2,6-di-n-propyl-1,4-phenylene ether), poly(2-methyl-6-isopropyl-1,4-phenylene ether), poly(2-chloro-6-methyl-1,4-phenylene ether), poly(2-methyl-6-ethyl-1,4-phenylene ether), poly(2,6-dibromo-1,4-phenylene ether), poly(2,6-dichloro-1,4-phenylene ether), poly(2,6-diethyl-1,4-phenylene ether), and poly(2,6-dimethyl-1,4-phenylene ether).

Further examples of the suitable polyphenylene ether include copolymers, such as copolymers derived from two or more types of phenol which are used for preparation of the homopolymers described above. Still further examples of the suitable polyphenylene ether include graft copolymers and block copolymers derived from vinylaromatic compounds, such as polystyrene, and the polyphenylene ether described above. Among these compounds, poly(2,6-dimethyl-1,4-phenylene ether) is particularly preferably used.

The molecular weight of component (a) is not particularly limited. The inherent viscosity of component (a) which is measured in chloroform at 25° C. is preferably 0.35 dl/g or more, more preferably 0.4 dl/g or more. When the inherent viscosity is less than 0.35 dl/g, the melt viscosity is low to cause inferior stability of strands and smaller effect of improving toughness when the component is used for a syndiotactic polystyrenic resin composition, and such an inherent viscosity is not preferable.

As the modifier used for modifying the polyphenylene ether, fumaric acid or a derivative of fumaric acid, such as a diester of fumaric acid, a metal salt of fumaric acid, ammonium salt of fumaric acid, and a halide of fumaric acid, is used in the present invention.

The amount of component (b) used in the composition is selected in the range of 0.1 to 5.0 parts by weight, preferably in the range of 0.5 to 4.0 parts by weight, per 100 parts by weight of component (a). When the used amount is less than 0.1 part by weight, the degree of modification is low, and the modified PPO thus obtained is substantially not different from the original unmodified PPO in some cases. Using an amount more than 5.0 parts by weight shows only a limited effect of increasing the degree of modification. When the used amount is selected in the range of 0.5 to 4.0 parts by weight per 100 parts by weight of component (a), the degree of modification is remarkably increased.

In the process of the present invention, a radical generating agent having a half-life of 1 minute at a temperature of 300° C. or higher can also be used in order to increase the degree of modification. When a radical generating agent having a half-life of 1 minute at a temperature of lower than 300° C., such as peroxides and azo compounds, is used, the increase in the degree of modification of PPO is occasionally insufficient.

As the radical generating agent, various compounds can be used. Specific examples include 2,3-dimethyl-2,3-diphenylbutane, 2,3-diethyl-2,3-diphenylbutane, 2,3-diethyl-2,3-diphenylhexane, 2,3-diethyl-2,3-di(p-methylphenyl)butane, and the like. Among these compounds, 2,3-dimethyl-2,3-diphenylbutane having a half-life of 1 minute at 330° C. is preferably used.

The used amount of the above radical generating agent is selected in the range of 0.1 to 5.0 parts by weight, preferably in the range of 0.3 to 5.0 parts by weight, more preferably in the range of 0.5 to 2.0 parts by weight. When the used amount is less than 0.1 parts by weight, the effect of the radical generating agent on increasing the degree of modification is small. When the used amount of the radical generating agent is more than 3.0 parts by weight, the effect of the radical generating agent on increasing the degree of modification is decreased. Thus, an amount outside of the specified range is not preferable. When the used amount is in the range of 0.5 to 2.0 parts by weight, the effect of the radical generating agent on increasing the degree of modification is remarkably exhibited.

The acid-modified PPO can be obtained by bringing PPO of component (a) into reaction with the modifier of component (b) and optionally the radical generating agent of component (c).

As the specific procedure, the above components are homogeneously dry blended and brought into the reaction with each other by melt kneading at a resin temperature in the range of 300 to 350° C. A resin temperature lower than 300° C. is not preferable because the melt viscosity is high and, moreover, the effect of increasing the degree of modification is low. A resin temperature higher than 350° C. is not preferable either because the decomposition reaction of PPO takes place.

The reaction can be conducted in accordance with a conventional method when it is possible that the reaction is performed by using a roll mill, a Banbury mixer, or an extruder at a prescribed temperature. Among these methods, it is preferred that the reaction is performed in an extruder because of the convenience in the procedure. When an extruder is used, it is preferred that vacuum vents are used in view of the removal of the residual modifier and the stability of the strands.

It is also possible that thermoplastic resins other than component (a) and various types of additive are added during the modification as long as the object of the present invention is not adversely affected. The used amount of the thermoplastic resins other than component (a) is not particularly limited and is preferably 100 parts by weight or less per 100 parts by weight of PPO of component (a). Examples of the thermoplastic resin other than component (a) include styrenic resins, thermoplastic elastomers, polyolefins, polyamides, and the like.

When PPO modified with fumaric acid obtained as described above is used in a composite or an alloy containing syndiotactic polystyrene (SPS), a resin composition having a superior toughness and color tone than those of a resin composition using PPO modified with maleic acid to the same level can be obtained.

The resin composition of the present invention comprises (d) a styrenic resin having the syndiotactic configuration, (e) the acid-modified polyphenylene ether obtained in accordance with the process described above, and optionally (f) inorganic fillers.

The syndiotactic configuration of the styrenic polymer of component (d) means that the stereochemical structure has a highly syndiotactic configuration. In other words, phenyl groups and substituted phenyl groups of the side groups are alternately placed at the opposite positions with respect to the main chain formed with the carbon-carbon bonds. The tacticity in the stereochemical structure is quantitated by the measurement of the nuclear magnetic resonance using an isotope of carbon ($^{13}$C-NMR). The tacticity measured by the $^{13}$C-NMR method can show the content of a sequence in which a specific number of the constituting units are bonded in sequence, such as a diad in which two constituting units are bonded in sequence, a triad in which three constituting units are bonded in sequence, and a pentad in which five constituting units are bonded in sequence. In the present invention, "the styrenic polymer having the syndiotactic configuration" means polystyrene, a poly(alkylstyrene), a poly(halogenated styrene), a poly(halogenated alkylstyrene), a poly(alkoxystyrene), a poly(vinylbenzoic acid ester), a hydrogenated derivative of these polymers, a mixture of these polymers, or a copolymer containing constituting units of these polymers as the main components, which generally has a syndiotacticity of 75% or more, preferably 85% or more, expressed in terms of the content of the racemic diad, or 30% or more, preferably 50% or more, expressed in terms of the content of the racemic pentad. Examples of the poly(alkylstyrene) include poly (methylstyrene), poly(ethylstyrene), poly(isopropylstyrene), poly(tertiary-butylstyrene), poly(phenylstyrene), poly (vinylnaphthalene), poly(vinylstyrene), and the like. Examples of the poly(halogenated styrene) include poly (chlorostyrene), poly(bromostyrene), poly(fluorostyrene), and the like. Examples of the poly(halogenated alkylstyrene) include poly(chloromethylstyrene) and the like. Examples of the poly(alkoxystyrene) include poly(methoxystyrene), poly (ethoxystyrene), and the like.

Particularly preferable examples of the styrenic polymers described above include polystyrene, poly(p-methylstyrene), Poly(m-methylstyrene), poly(p-tertiary-butylstyrene), poly(p-chlorostyrene), poly(m-chlorostyrene), poly(p-fluorostyrene), hydrogenated polystyrene, and copolymers containing constituting units of the above polymers.

A single type or a combination of two or more types of the above styrenic polymer may be used.

The molecular weight of the styrenic polymer is not particularly limited. The weight-average molecular weight is preferably 10,000 or more, more preferably 50,000 or more. The broadness of the molecular weight distribution is not limited either, and polymers having various molecular weight distribution can be used. A polymer having a weight-average molecular weight of less than 10,000 is not preferable because thermal properties and mechanical properties of the obtained composition or the molded products obtained from the composition are occasionally decreased.

The above styrenic polymer having the syndiotactic configuration can be produced by polymerizing a styrenic monomer (a monomer corresponding to the above styrenic polymer) in an inert hydrocarbon solvent or in the absence of solvents by using a titanium compound and a condensation product of water and trialkylaluminum as the catalyst (the specification of Japanese Patent Application Laid-Open No. Showa 62(1987)-187708). The above poly(halogenated alkylstyrene) can be produced in accordance with the process described in the specification of Japanese Patent Application Laid-Open No. Heisei 1(1989)-46912, and the above hydrogenated derivative of the polymer described above can be produced in accordance with the process described in the specification of Japanese Patent Application Laid-Open No. Heisei 1(1989)-178505.

In the resin composition of the present invention, (d') a rubbery elastomer and/or (d") a polyamide can be used to replace a part of SPS.

Specific examples of the rubbery elastomer of component (d') include natural rubber, polybutadiene, polyisoprene, polyisobutylene, neoprene, polysulfide rubber, thiokol rubber, acrylic rubber, urethane rubber, silicone rubber, epichlorohydrin rubber, styrene-butadiene block copolymers (SBR), hydrogenated styrene-butadiene block copolymers (SEB), styrene-butadiene-styrene block copolymers (SBS), hydrogenated styrene-butadiene-styrene block copolymers (SEBS), styrene-isoprene block copolymers (SIR), hydrogenated styrene-isoprene block copolymers (SEP), styrene-isoprene-styrene block copolymers (SIS), hydrogenated styrene-isoprene-styrene block copolymers (SEPS), styrene-butadiene random copolymers, hydrogenated styrene-butadiene random copolymers, styrene-ethylene-propylene random copolymers, styrene-ethylene-butylene random copolymers, ethylene-propylene rubber (EPR), ethylene-propylene-diene rubber (EPDM), core-shell type particulate elastomers, such as butadiene-acrylonitrile-styrene core-shell rubber (ABS), methyl methacrylate-butadiene-styrene core-shell rubber (MBS), methyl methacrylate-butyl acrylate-styrene core-shell rubber (MAS), octyl acrylate-butadiene-styrene core-shell rubber (MABS), an alkyl acrylate-butadiene-acrylonitrile-styrene core-shell rubber (AABS), butadiene-styrene core-shell rubber (SBR), and core-shell rubbers containing siloxane such as methyl methacrylate-butyl acrylate-siloxane and the like, and rubbers obtained by modification of these rubbers. Among these rubbers, SBR, SER, SBS, SEBS, SIR, SEP, SIS, SEPS, core-shell rubbers containing the styrene unit, and rubbers obtained by modification of these rubbers are preferably used.

A single type or a combination of two or more types of these rubbery elastomer can be used.

When the rubbery elastomer is used in the resin composition, the amount of the rubbery elastomer is in the range of 3 to 50% by weight, preferably in the range of 5 to 40% by weight, based on the total amount of the resin in view of the modulus and the heat resistance. When the amount is less than 3% by weight, the effect of improving the impact resistance is small. When the amount is more than 50% by weight, the modulus and the heat resistance of the composition are occasionally decreased. When the amount is in the range of 5 to 40% by weight, the improvement in the impact resistance, the modulus, and the heat resistance is more remarkably exhibited.

As the polyamide of component (d"), a conventional polyamide can be selected and used as desired. Examples of the suitable polyamide include polyamide-4, polyamide-6, polyamide-6,6, polyamide-3,4, polyamide-12, polyamide-11, polyamide-6,10, a polyamide obtained from terephthalic acid and 4,4'-diaminohexylmethane, a polyamide obtained from azelaic acid, adipic acid, and 2,2-bis(p-cyclohexyl)propane, and a polyamide obtained from adipic acid and m-xylylenediamine.

An aromatic polyamide resin is a polyamide which contains repeating units having aromatic rings and an amide bond. The aromatic polyamide can be selected as desired from polymers obtained by the reaction of aromatic diamine components and dicarboxylic acid components in accordance with a conventional process and polymers obtained by the reaction of diamine components and dicarboxylic acid components having aromatic rings in accordance with a conventional process.

As the aromatic diamine component, a diamine having a benzene ring, such as 1,4-diaminobenzene, 1,3-diaminobenzene, 1,2-diaminobenzene, 2,4-diaminotoluene, 2,3-diaminotoluene, 2,5-diaminotoluene, 2,6-diaminotoluene, o-, m-, or p-xylylenediamine, o-, m-, or p-2,2'-diaminodiethylbenzene, 4,4'-diaminobiphenyl, 4,4'-diaminodiphenylmethane, 4,4'-diaminodiphenyl ether, 4,4'-diaminodiphenyl thioether, 4,4'-diaminodiphenyl ketone, 4,4'-diaminoiphenyl sulfone, and the like, is used. The aromatic diamine component may be the above diamine having a benzene ring alone or may also be a mixture of the above diamine having a benzene ring with other diamines, such as aliphatic diamines, as long as the mixture contains the diamine having a benzene ring. Of course, a mixture of two or more types of the diamine having a benzene ring may be used.

Examples of the dicarboxylic acid component include aliphatic dicarboxylic acids, such as glutaric acid, adipic acid, pimellic acid, suberic acid, azelaic acid, sebacic acid, and the like; aromatic carboxylic acids, such as phthalic acid, isophthalic acid, terephthalic acid, naphthalenedicarboxylic acid, and the like; and esters and chlorides of these dicarboxylic acids. A single type or a combination of two or more types of the dicarboxylic acid may be used.

The aromatic polyamide resin can also be obtained by polymerization of an ω-amino-ω'-carboxyl compound having an aromatic ring. Examples of the ω-amino-ω'-carboxyl compound having an aromatic ring include 4-aminophenylcarboxylmethane, 1-(4-aminophenyl)-2-carboxylmethane, 3-(4-aminophenyl)-1-carboxylpropane, p-(3-amino-3'-carboxy)dipropylbenzene, and the like.

Preferable examples of the aromatic polyamide resin include polyamides derived from diamines having a benzene ring and aliphatic dicarboxylic acids. More preferable examples include the polyamide derived from xylylenediamine and adipic acid.

A single type or a combination of two or more types of the polyamide may be used.

The amount of the polyamide is 10 to 90% by weight, preferably 20 to 80% by weight, more preferably 30 to 70% by weight, based on the total amount of the resin. When the amount is less than 10% by weight, the effect of component (d) on improving the mechanical strength of SPS is small. When the amount is more than 90% by weight, the water resistance and the stability against acids or alkalis occasionally remain at the same level as that of the polyamide alone. When the used amount of the polyamide is selected in the range of 20 to 80% by weight, the effect of improving the mechanical strength of SPS is increased, and the effect is remarkably exhibited when the used amount is in the range of 30 to 70% by weight.

In the resin composition of the present invention, PPO modified with fumaric acid is comprised as component (e). The amount of PPO modified with fumaric acid comprised in the resin composition is 0.5 to 5.0% by weight, preferably 1.0 to 5.0% by weight, when the polyamide of component (d") is not used as a resin component in the resin composition. When the amount is less than 0.5% by weight, the adhesive strength with the inorganic filler of component (f) is low to cause decrease in the effect of improving the impact resistance. When the amount is more than 5.0% by weight, the molding property is occasionally deteriorated. When the amount is in the range of 1.0 to 5.0% by weight, the impact resistance is remarkably improved without causing adverse effect on the molding property.

When the polyamide of component (d") is used as a resin component in the resin composition, the amount of PPO modified with fumaric acid of component (e) comprised in the resin composition is selected in the range of 0.5 to 10.0% by weight, preferably 1.0 to 8.0% by weight. When the amount is less than 0.5% by weight, the effect of improving the compatibility between SPS of component (d) and the polyamide of component (d") and the effect of improving adhesion with inorganic fillers of component (f) are small to cause decrease in the effect of improving the impact resistance. When the amount is more than 10.0% by weight, the molding property is occasionally deteriorated. When the amount is in the range of 1.0 to 8.0, the effect of improving the compatibility between SPS and the polyamide and the effect of improving the impact resistance are remarkably exhibited.

In the resin composition of the present invention, inorganic filler can also be comprised as component (f). The shape of the inorganic filler is not particularly limited and may be any of fibers, granules, and powder. Examples of the inorganic filler having a fiber shape include glass fiber, carbon fiber, wiskers, and the like. The inorganic filler having a fiber shape may have a form of a cloth, a mat, a cut bundle, short fibers, filaments, wiskers, or the like. When the inorganic filler has a form of a cut bundle, it is preferred that the length is 0.05 to 50 mm, and the diameter of the fiber is 5 to 20 $\mu$m. Examples of the inorganic filler having a granular shape or a powder shape include talc, carbon black, graphite, titanium dioxide, silica, mica, calcium carbonate, calcium sulfate, barium carbonate, magnesium carbonate, magnesium sulfate, barium sulfate, calcium oxysulfate, tin oxides, alumina, kaolin, silicon carbide, metal powders, glass powder, glass flakes, glass beads, and the like. Among these inorganic fillers, glass fillers, such as glass powder, glass flakes, glass beads, glass filaments, glass fibers, glass rovings, glass mats, and the like, are particularly preferable.

As the above inorganic filler, fillers which have been treated with a coupling agent on the surface thereof are preferable. The coupling agent for the surface treatment is used in order to improve the adhesion between the inorganic filler and the resin and can be selected as desired from conventional coupling agents, such as silane coupling agents, titanium coupling agents, and the like. Among these coupling agents, aminosilanes, such as γ-aminopropyltrimethoxysilane, N-β-(aminomethyl)-γ-aminopropyltrimethoxysilane, and the like; epoxysilanes, such as γ-glycidoxypropyltrimethoxysilane, β-(3,4-epoxycyclohexyl), ethyltrimethoxysilane, and the like; and isopropyltri(N-amidoethyl, aminoethyl)titanate are preferable.

The surface treatment of the above inorganic filler by using the above coupling agent can be conducted in accordance with a conventional process and is not particularly limited. For example, the sizing treatment, the dry mixing process, or the spraying process can preferably be conducted.

A film forming substance for glass may be used in combination with the above coupling agent. The film forming substance is not particularly limited and can be selected from conventional film forming substances. Among the conventional film forming substances, urethane film forming substances, epoxy film forming substances, polyether film forming substances, and the like are preferably used.

A single type or a combination of two or more types of the inorganic filler may be used. The used amount of the inorganic filler is selected in the range of 1 to 350 parts by weight, preferably 5 to 200 parts by weight, based on 100 parts by weight of the above resin composition. When the amount is less than 1 part by weight, the effect of the filler is not sufficiently exhibited. When the amount is more than 350 parts by weight, drawbacks arise in that dispersion is inferior and that molding becomes difficult.

In the resin composition of the present invention, various types of additional components, such as additives such as antioxidants, nucleating agents, plasticizers, releasing agents, flame retardants, pigments, carbon black, antistatic agents, and the like and other thermoplastic resins, may be comprised within the range that the objects of the present invention are not adversely affected.

As the nucleating agent, a nucleating agent can be selected as desired from conventional nucleating agents, such as metal salts of carboxylic acids such as aluminum di(p-t-butylbenzoate) and the like; metal salts of phosphoric acid such as sodium methylenebis(2,4-di-t-butylphenol) acid phosphate and the like; talc; phthalocyanine derivatives; and the like.

As the plasticizer, a conventional plasticizer can be selected as desired from conventional plasticizers, such as polyethylene glycol, polyamide oligomers, ethylenebisstearoamide, esters of phthalic acid, polystyrene oligomers, polyethylene wax, mineral oils, silicone oils, and the like.

As the releasing agent, a releasing agent can be selected as desired from conventional releasing agents, such as polyethylene wax, silicone oils, long chain carboxylic acids, salts of long chain carboxylic acids, and the like.

As the antioxidant, an antioxidant can be selected as desired from conventional antioxidants, such as antioxidants containing phosphorus, phenolic antioxidants, antioxidants containing sulfur, and the like. Specific examples of the antioxidant include (2,6-di-t-buyl-4-methylphenyl) pentaerythritol diphosphite (a product of ADEKA ARGUS Co., Ltd.; PEP-36), tetrakis(methylene-3-(3',5'-di-t-butyl-4'-hydroxyphenyl)) propionate (a product of ADEKA ARGUS Co., Ltd.; MARKAO 60), and the like. A single type or a combination of two or more types of the antioxidant may be used.

As the flame retardant, a flame retardant can be selected as desired from conventional flame retardants, such as brominated polymers such as brominated polystyrene, brominated syndiotactic polystyrene, brominated polyphenylene ether, and the like and brominated aromatic compounds such as brominated diphenylalkanes, brominated diphenyl ethers, and the like. As the auxiliary flame retardant, an auxiliary flame retardant is selected as desired from conventional auxiliary flame retardants, such as antimony compounds such as antimony trioxide and the like and other auxiliary flame retardants. A single type or a combination of two or more types of the flame retardant or the auxiliary flame retardant may be used.

As the thermoplastic resin, a thermoplastic resin can be selected as desired from conventional thermoplastic resins, such as polyolefinic resins such as linear high density polyethylene, linear low density polyethylene, high pressure low density polyethylene, isotactic polypropylene, syndiotactic polypropylene, block polypropylene, random polypropylene, polybutene, cyclic polyolefins, and the like; polystyrenic resins such as polystyrene, HIPS, ABS, AS, and the like; polycarbonates; polyester resins such as polyethylene terephthalate, polybutylene terephthalate, and the like; polyphenylene ethers; polyphenylene sulfides; and the like. A single type or a combination of two or more types of the thermoplastic resin may be used.

The styrenic resin composition of the present invention is prepared by mixing and blending the above essential components and optionally the above components in the amounts specified in the above. As the method of blending, a conventional method, such as the melt kneading, the solution blending, and the like, can suitably be used. A method other than the above methods may also be used as the method of mixing the inorganic filler. In one of such methods, a sheet comprising the resin components or the resin composition and a glass mat are laminated together, and the laminate is melted. In another such method, the resin components or the resin composition and the inorganic filler are mixed in a fluid to form a slurry, and after the slurry is allowed to precipitate, the precipitate is heated. It is generally preferred that the mixing is conducted in accordance with a conventional melt kneading using a Banbury mixer, a Henschel mixer, a mixing roll, a single screw extruder, a twin screw extruder, or the like.

The present invention is described in more detail with reference to examples and comparative examples in the following. However, the present invention is not limited by these examples and comparative examples.

EXAMPLE 1

One kg of polyphenylene ether (inherent viscosity, 0.45 dl/g, in chloroform at 25° C.) as component (a) and 10 g of fumaric acid as component (b) were dry blended. The obtained blend was melt kneaded by using a 30 mm twin screw extruder at a rotation speed of 200 rpm at a set temperature of 300° C. while volatile components were removed through vacuum vents. The temperature of the resin was about 330° C. The obtained strands had a sufficient viscosity, and a stable production was possible. Almost no irritating smell was felt around the extruder. After being cooled, the strands were formed into pellets to obtain a polyphenylene ether modified with fumaric acid.

For the measurement of the degree of modification, 1 g of the modified polyphenylene ether obtained above was dissolved into ethylbenzene and reprecipitated with methanol. The recovered polymer was extracted with methanol by a Soxhlet extractor and dried. The degree of modification was obtained from the intensity of the absorption of carbonyl group in the infrared spectrum of the obtained polymer and also by titration of the obtained polymer. The degree of modification was found to be 0.3% by weight.

The conditions observed in the modification (the stability of strands and the degree of irritating smell) and the properties of the modified PPO (the color tone, the number-average molecular weight, and the degree of modification) are shown in Table 1. The stability of strands, the degree of irritating smell, and the color tone were evaluated by classifying them into 10 degrees represented by 1 to 10, in which a smaller number shows a better condition and a larger number shows an inferior condition. The number-average molecular weight was measured by using the gel permeation chromatography and calibrated by using polystyrene as the reference material.

EXAMPLES 2 AND 3

The same procedures as those conducted in Example 1 were conducted except that the used amount of fumaric acid of component (b) was varied as shown in Table 1. The conditions observed in the modification and the properties of the modified products are shown in Table 1.

EXAMPLE 4

One kg of polyphenylene ether (inherent viscosity, 0.45 dl/g, in chloroform at 25° C.) as component (a), 10 g of fumaric acid as component (b), and 10 g of 2,3-dimethyl-2,3-diphenylbutane (a product of NIPPON YUSHI Co., Ltd., NOFMER BC) as the radical generating agent of component (c) were dry blended. The obtained blend was melt kneaded by using a 30 mm twin screw extruder at a rotation speed of 200 rpm at a set temperature of 300° C. while volatile components were removed through vacuum vents. The temperature of the resin was about 330° C. The obtained strands had a sufficient viscosity, and a stable production was possible. Almost no irritating smell was felt around the extruder. After being cooled, the strands were formed into pellets to obtain a polyphenylene ether modified with fumaric acid.

For the measurement of the degree of modification, 1 g of the modified polyphenylene ether obtained above was dissolved into ethylbenzene and reprecipitated with methanol. The recovered polymer was extracted with methanol by a Soxhlet extractor and dried. The degree of modification was obtained from the intensity of the absorption of carbonyl group in the infrared spectrum of the obtained polymer and also by titration of the obtained polymer. The degree of modification was found to be 0.9% by weight.

The conditions observed in the modification (the stability of strands and the degree of irritating smell) and the properties of the modified PPO (the color tone, the number-average molecular weight, and the degree of modification) are shown in Table 1. The stability of strands and the degree of irritating smell, and the color tone were evaluated by classifying them into 10 degrees represented by 1 to 10, in which a smaller number shows a superior condition and a larger number shows an inferior condition. The number-average molecular weight was measured by using the gel permeation chromatography and calibrated by using polystyrene as the reference material.

EXAMPLES 5 AND 6

The same procedures as those conducted in Example 4 were conducted except that the used amounts of fumaric acid of component (b) and the radical generating agent of component (c) were varied as shown in Table 1. The results of evaluation of the conditions observed in the modification and the properties of the modified products are shown in Table 1.

COMPARATIVE EXAMPLE 1

The same procedures as those conducted in Example 1 were conducted except that the polyphenylene ether of component (a) alone was used. The results of measurement of the properties are shown in Table 1.

COMPARATIVE EXAMPLE 2

The same procedures as those conducted in Example 1 were conducted except that the temperature of the resin was adjusted to less than 300° C. and the radical generating agent was not used. The results of evaluation of the conditions observed in the modification and the properties of the modified product are shown in Table 1.

COMPARATIVE EXAMPLE 3

The same procedures as those conducted in Example 4 were conducted except that the temperature of the resin was adjusted to less than 300° C. The results of evaluation of the conditions observed in the modification and the properties of the modified product are shown in Table 1.

COMPARATIVE EXAMPLE 4

The same procedures as those conducted in Example 4 were conducted except that cumene hydroperoxide which has the half-life of 1 minute at 255° C. was used as the radical generating agent of component (c). The results of evaluation of the conditions observed in the modification and the properties of the modified product are shown in Table 1.

COMPARATIVE EXAMPLE 5

The same procedures as those conducted in Example 4 were conducted except that dicumyl peroxide which has the half-life of 1 minute at 171° C. was used as the radical generating agent of component (c). The results of evaluation of the conditions observed in the modification and the properties of the modified product are shown in Table 1.

COMPARATIVE EXAMPLE 6 TO 8

The same procedures as those conducted in Examples 1, 2, and 3 were conducted in Comparative Examples 6, 7, and 8, respectively, except that maleic anhydride was used as component (b) in place of fumaric acid and the radical generating agent was not used. The results of evaluation of the conditions observed in the modification and the properties of the modified product are shown in Table 1.

COMPARATIVE EXAMPLE 9 TO 11

The same procedures as those conducted in Examples 4, 5, and 6 were conducted in Comparative Examples 9, 10, and 11, respectively, except that maleic anhydride was used as component (b) in place of fumaric acid. The results of evaluation of the conditions observed in the modification and the properties of the modified product are shown in Table 1.

TABLE 1-1

| | formulation | | | | | |
|---|---|---|---|---|---|---|
| | PPO | modifier | | radical generating agent | | |
| | amount g | type | amount g | type | temp. of 1 min. half-life °C. | amount g |
| Example | | | | | | |
| 1 | 1000 | *1 | 10 | — | — | — |
| 2 | 1000 | *1 | 20 | — | — | — |
| 3 | 1000 | *1 | 30 | — | — | — |
| 4 | 1000 | *1 | 10 | 2,3-dimethyl-2,3-diphenylbutane | 330 | 20 |
| 5 | 1000 | *1 | 20 | 2,3-dimethyl-2,3-diphenylbutane | 330 | 20 |
| 6 | 1000 | *1 | 30 | 2,3-dimethyl-2,3-diphenylbutane | 330 | 20 |
| Comparative Example | | | | | | |
| 1 | 1000 | — | — | — | — | — |
| 2 | 1000 | *1 | 30 | — | — | — |
| 3 | 1000 | *1 | 30 | 2,3-dimethyl-2,3-diphenylbutane | 330 | 20 |
| 4 | 1000 | *1 | 30 | cumene hydroperoxide | 255 | 20 |
| 5 | 1000 | *1 | 30 | dicumyl peroxide | 171 | 20 |
| 6 | 1000 | *2 | 10 | — | — | — |
| 7 | 1000 | *2 | 20 | — | — | — |
| 8 | 1000 | *2 | 30 | — | — | — |
| 9 | 1000 | *2 | 10 | 2,3-dimethyl-2,3-diphenylbutane | 330 | 20 |
| 10 | 1000 | *2 | 20 | 2,3-dimethyl-2,3-diphenylbutane | 330 | 20 |
| 11 | 1000 | *2 | 30 | 2,3-dimethyl-2,3-diphenylbutane | 330 | 20 |

*1: fumaric acid
*2: maleic anhydride

TABLE 1-2

| | results | | | | | |
|---|---|---|---|---|---|---|
| | condition of modification resin temp. °C. | condition in modification stability of strands 1 to 10 for good to poor | irritating smell 1 to 10 for good to poor | color tone 1 to 10 for good to poor | number-average molecular weight | degree of modification |
| Example | | | | | | |
| 1 | 330 | 1 | 2 | 2 | 20000 | 0.42 |
| 2 | 328 | 1 | 3 | 3 | 19800 | 0.61 |
| 3 | 325 | 2 | 3 | 3 | 19500 | 0.78 |
| 4 | 325 | 2 | 2 | 3 | 18500 | 0.92 |
| 5 | 329 | 2 | 3 | 4 | 17900 | 1.43 |
| 6 | 323 | 3 | 3 | 4 | 17100 | 1.82 |
| Comparative Example | | | | | | |
| 1 | 330 | 1 | 1 | 1 | 20100 | 0.00 |
| 2 | 284 | 1 | 3 | 2 | 19800 | 0.38 |
| 3 | 285 | 2 | 2 | 2 | 19400 | 1.18 |
| 4 | 328 | 2 | 3 | 2 | 19500 | 0.80 |
| 5 | 325 | 2 | 3 | 2 | 19500 | 0.76 |
| 6 | 326 | 4 | 9 | 7 | 16800 | 0.45 |
| 7 | 330 | 5 | 10 | 8 | 15900 | 0.65 |
| 8 | 331 | 6 | 10 | 9 | 15100 | 0.81 |
| 9 | 329 | 8 | 8 | 9 | 12300 | 0.90 |
| 10 | 330 | 9 | 9 | 10 | 10900 | 1.39 |
| 11 | 325 | 10 | 10 | 10 | 9600 | 1.80 |

As can clearly be understood from the results shown in Table 1, by using fumaric acid which is harmless as component (c) and the radical generating agent showing a half-life of 1 minute at a temperature of 300° C. or more and by conducting the modification in a melt at a temperature in the range of 300 to 350° C., the working environment around the extruder could remarkably be improved, decrease in the molecular weight could be suppressed, and the acid-modified PPO having a superior color tone could be produced in comparison with the cases in which maleic acid was used as component (b).

EXAMPLE 7

(1) Preparation of SPS

Into a reactor having an inner volume of 2 liter, 1.0 liter of purified styrene and 1 mmol of triethylaluminum were charged, and the mixture was heated to 80° C. To the heated mixture, 16.5 mmol of a preliminarily mixed catalyst (prepared by using 90 micromol of pentamethylcylcopentadienyltitanium trimethoxide, 90 micromol of dimethylanilinium tetra(pentafluorophenyl) borate, 29.1 mmol of toluene, and 1.8 mmol of triisobutylaluminum) was added, and the polymerization was allowed to proceed at 80° C. for 5 hours. After the reaction was finished, the reaction product was repeatedly washed with methanol and dried to obtain 380 g of a polymer.

The weight-average molecular weight of the obtained polymer was measured by the gel permeation chromatography by using 1,2,4-trichlorobenzene as the solvent at 130° C. and found to be 320,000. The ratio of the weight-average molecular weight to the number-average molecular weight was 2.60. By the measurements of the melting point and the $^{13}$C-NMR spectrum, it was confirmed that the obtained polymer was a polystyrene having the syndiotactic configuration (SPS).

(2) To 100 parts by weight of the syndiotactic polystyrene obtained in (1) in the above (the weight-average molecular weight, 320,000; and the weight-average molecular weight/the number-average molecular weight, 2.60), 1.5 parts by weight of PPO modified with fumaric acid which was obtained in Examples 3 as component (e), 0.1 part by weight of (2,6-di-t-butyl-4-methylphenyl)pentaerythritol diphosphite (a product of ADEKA ARGUS Co., Ltd.; PEP-36) and 0.1 part by weight of tetrakis(methylene-3-(3',5'-di-t-butyl-4'-hydroxyphenyl)) propionate (a product of ADEKA ARGUS Co., Ltd.; MARKAO 60) as the antioxidants, and 0.5 parts by weight of sodium methylenebis(2,4-di-t-butylphenol) acid phosphate (a product of ADEKA ARGUS Co., Ltd.; NA-11) as the nucleating agent were added, and the components were dry blended by a Henschel mixer. The obtained blend was melt kneaded by a twin screw extruder while 43 parts by weight of glass fiber (a product of ASAHI FIBER GLASS Co., Ltd.; FT-712; 10 μm/3 mm) as component (f) was added by side feeding to obtain pellets. By using the obtained pellets, test pieces for the Izod impact test and the tensile test were prepared by the injection molding. The Izod impact strength and the tensile strength were measured by using the obtained test pieces. The color tone was evaluated by visual observation. The results are shown in Table 2.

EXAMPLE 8

The same procedures as those conducted in Example 7 were conducted except that PPO modified with fumaric acid which was obtained in Example 6 was used as component (e). The results are shown in Table 2.

COMPARATIVE EXAMPLES 12 AND 13

The same procedures as those conducted in Example 7 and 8 were conducted in Comparative Examples 12 and 13, respectively, except that materials shown in Table 2 were used as component (e). The results are shown in Table 2.

EXAMPLE 9

To 100 parts by weight of a mixture composed of 90% by weight of the syndiotactic polystyrene prepared in Example 7 (1) in the above (the weight-average molecular weight, 320,000; and the weight-average molecular weight/the number-average molecular weight, 2.60) as component (d) and 10% by weight of a hydrogenated styrene-butadiene-styrene block copolymer (hereinafter, abbreviated as SEBS) (a product of KURARAY Co., Ltd.; SEPTON KL-8006) as component (d'), 1.5 parts by weight of PPO modified with fumaric acid which was obtained in Examples 3 as component (e), 0.1 part by weight of (2,6-di-t-butyl-4-methylphenyl)pentaerythritol diphosphite (a product of ADEKA ARGUS Co., Ltd.; PEP-36) and 0.1 part by weight of tetrakis(methylene-3-(3',5'-di-t-butyl-4'-hydroxyphenyl)) propionate (a product of ADEKA ARGUS Co., Ltd.; MARKAO 60) as the antioxidants, and 0.5 parts by weight of sodium methylenebis(2,4-di-t-butylphenol) acid phosphate (a product of ADEKA ARGUS Co., Ltd.; NA-11) as the nucleating agent were added, and the components were dry blended by a Henschel mixer. The obtained blend was melt kneaded by a twin screw extruder while 43 parts by weight of glass fiber (a product of ASAHI FIBER GLASS Co., Ltd.; FT-712; 10 μm/3 mm) as component (f) was added by side feeding to obtain pellets. By using the obtained pellets, test pieces for the Izod impact test and the tensile test were prepared by the injection molding. The Izod impact strength and the tensile strength were measured by using the obtained test pieces. The color tone was evaluated by visual observation. The results are shown in Table 2.

EXAMPLE 10

The same procedures as those conducted in Example 9 were conducted except that PPO modified with fumaric acid which was obtained in Example 6 was used as component (e). The results are shown in Table 2.

COMPARATIVE EXAMPLES 14 AND 15

The same procedures as those conducted in Example 9 and 10 were conducted in Comparative Examples 14 and 15, respectively, except that materials shown in Table 2 were used as component (e). The results are shown in Table 2.

TABLE 2-1

| | formulation | | | | | |
|---|---|---|---|---|---|---|
| | (d) SPS mol. wt. | (d') rubber SEBS KURARAY | (d") polyamide PA66 UBE | (e) acid-modified PPO | | (f) inorganic filler glass fiber ASAHI FIBER |
| | 320,000 g | KL8006 g | PA2020B g | type — | amount g | GLASS FT712 g |
| Example 7 | 100 | 0 | 0 | Example 3 | 1.5 | 43 |
| Example 8 | 100 | 0 | 0 | Example 6 | 1.5 | 43 |
| Example 9 | 90 | 10 | 0 | Example 3 | 1.5 | 43 |
| Example 10 | 90 | 10 | 0 | Example 6 | 1.5 | 43 |
| Comparative Example 12 | 100 | 0 | 0 | Comparative Example 8 | 1.5 | 43 |
| Comparative Example 13 | 100 | 0 | 0 | Comparative Example 11 | 1.5 | 43 |
| Comparative Example 14 | 90 | 10 | 0 | Comparative Example 8 | 1.5 | 43 |
| Comparative Example 15 | 90 | 10 | 0 | Comparative Example 11 | 1.5 | 43 |

TABLE 2-2

| | results | | |
|---|---|---|---|
| | physical properties | | |
| | Izod impact strength method of JIS K-7110 with a notch (KJ/m$^2$) | tensile property elongation method of JIS K-7113 (%) | color tone 1 to 10 for good to poor |
| Example 7 | 9.0 | 1.7 | 2 |
| Example 8 | 10.0 | 1.9 | 4 |
| Example 9 | 10.6 | 2.1 | 1 |
| Example 10 | 11.4 | 2.3 | 3 |
| Comparative Example 12 | 8.5 | 1.5 | 6 |
| Comparative Example 13 | 9.4 | 1.7 | 8 |
| Comparative Example 14 | 10.1 | 1.9 | 7 |
| Comparative Example 15 | 10.8 | 2.0 | 9 |

As can clearly be understood from Table 2, by using PPO modified with fumaric acid which was obtained in accordance with the process of the present invention in the composite containing SPS, the compositions having superior toughness and color tone to those of the compositions using PPO modified with maleic acid to the same level of the degree of modification could be obtained.

EXAMPLE 11

To 100 parts by weight of a mixture composed of 45% by weight of the syndiotactic polystyrene prepared in Example 7 (1) in the above (the weight-average molecular weight, 320,000; and the weight-average molecular weight/the number-average molecular weight, 2.60) as component (d), 50% by weight of a polyamide (a product of UBE KOSAN Co., Ltd.; 2020B) as component (d"), and 5% by weight of PPO modified with fumaric acid which was obtained in Example 3 as component (e), 0.1 part by weight of (2,6-di-t-butyl-4-methylphenyl)pentaerythritol diphosphite (a product of ADEKA ARGUS Co., Ltd.; PEP-36) and 0.1 part by weight of tetrakis(methylene-3-(3',5'-di-t-butyl-4'-hydroxyphenyl)) propionate (a product of ADEKA ARGUS Co., Ltd.; MARKAO 60) were added as the antioxidants, and the components were dry blended by a Henschel mixer. The obtained blend was melt kneaded by a twin screw extruder to obtain pellets. By using the obtained pellets, test pieces for the Izod impact test and the tensile test were prepared by the injection molding. The Izod impact strength and the tensile strength were measured by using the obtained test pieces. The color tone was evaluated by visual observation. The results are shown in Table 3.

EXAMPLE 12

The same procedures as those conducted in Example 11 were conducted except that PPO modified with fumaric acid which was obtained in Example 6 was used as component (e). The results are shown in Table 3.

COMPARATIVE EXAMPLES 16 AND 17

The same procedures as those conducted in Example 11 and 12 were conducted in Comparative Examples 16 and 17, respectively, except that materials shown in Table 3 were used as component (e). The results are shown in Table 3.

EXAMPLE 13

To 100 parts by weight of a mixture composed of 40% by weight of the syndiotactic polystyrene prepared in Example 7 (1) in the above (the weight-average molecular weight, 320,000; and the weight-average molecular weight/the number-average molecular weight, 2.60) as component (d), 5% by weight of SEBS modified with maleic anhydride (a product of ASAHI KASEI Co., Ltd.; MX-072) as the rubbery elastomer of component (d'), 50% by weight of a polyamide (a product of UBE KOSAN Co., Ltd.; 2020B) as component (d"), and 5% by weight of PPO modified with fumaric acid which was obtained in Example 3 as component (e), 0.1 part by weight of (2,6-di-t-butyl-4-methylphenyl)pentaerythritol diphosphite (a product of ADEKA ARGUS Co., Ltd.; PEP-36) and 0.1 part by weight of tetrakis(methylene-3-(3',5'-di-t-butyl-4'-hydroxyphenyl)) propionate (a product of ADEKA ARGUS Co., Ltd.; MARKAO 60) were added as the antioxidants, and the components were dry blended by a Henschel mixer. The obtained blend was melt kneaded by a twin screw extruder to obtain pellets. By using the obtained pellets, test pieces for the Izod impact test and the tensile test were prepared by the injection molding. The Izod impact strength and the tensile strength were measured by using the obtained test pieces. The color tone was evaluated by visual observation. The results are shown in Table 3.

EXAMPLE 14

The same procedures as those conducted in Example 13 were conducted except that PPO modified with fumaric acid which was obtained in Example 6 was used as component (e). The results are shown in Table 3.

COMPARATIVE EXAMPLES 18 AND 19

The same procedures as those conducted in Example 13 and 14 were conducted in Comparative Examples 18 and 19, respectively, except that materials shown in Table 3 were used as component (e). The results are shown in Table 3.

EXAMPLE 15

To 100 parts by weight of a mixture composed of 45% by weight of the syndiotactic polystyrene prepared in Example 7 (1) in the above (the weight-average molecular weight, 320,000; and the weight-average molecular weight/the number-average molecular weight, 2.60) as component (d), 50% by weight of a polyamide (a product of UBE KOSAN Co., Ltd.; 2020B) as component (d"), and 5% by weight of PPO modified with fumaric acid which was obtained in Example 3 as component (e), 0.1 part by weight of (2,6-di-t-butyl-4-methylphenyl)pentaerythritol diphosphite (a product of ADEKA ARGUS Co., Ltd.; PEP-36) and 0.1 part by weight of tetrakis (methylene-3-(3',5-di-t-butyl-4'-hydroxyphenyl)) propionate (a product of ADEKA ARGUS Co., Ltd.; MARKAO 60) were added as the antioxidants, and the components were dry blended by a Henschel mixer. The obtained blend was melt kneaded by a twin screw extruder while 43 parts by weight of glass fiber (a product of ASAHI FIBER GLASS Co., Ltd.; FT-712; 10 μm/3 mm) as component (f) was added by side feeding to obtain pellets. By using the obtained pellets, test pieces for the Izod impact test and the tensile test were prepared by the injection molding. The Izod impact strength and the tensile strength were measured by using the obtained test pieces. The color tone was evaluated by visual observation. The results are shown in Table 3.

EXAMPLE 16

The same procedures as those conducted in Example 15 were conducted except that PPO modified with fumaric acid which was obtained in Example 6 was used as component (e). The results are shown in Table 3.

COMPARATIVE EXAMPLES 20 AND 21

The same procedures as those conducted in Example 15 and 16 were conducted in Comparative Examples 20 and 21, respectively, except that materials shown in Table 3 were used as component (e). The results are shown in Table 3.

EXAMPLE 17

To 100 parts by weight of a mixture composed of 40% by weight of the syndiotactic polystyrene prepared in Example 7 (1) in the above (the weight-average molecular weight, 320,000; and the weight-average molecular weight/the number-average molecular weight, 2.60) as component (d), 5% by weight of SEBS modified with maleic anhydride (a product of ASAHI KASEI Co., Ltd.; MX-072) as the rubbery elastomer of component (d'), 50% by weight of a polyamide (a product of UBE KOSAN Co., Ltd.; 2020B) as component (d"), and 5% by weight of PPO modified with fumaric acid which was obtained in Example 3 as component (e), 0.1 part by weight of (2,6-di-t-butyl-4-methylphenyl)pentaerythritol diphosphite (a product of ADEKA ARGUS Co., Ltd.; PEP-36) and 0.1 part by weight of tetrakis(methylene-3-(3',5'-di-t-butyl-4'-hydroxyphenyl)) propionate (a product of ADEKA ARGUS Co., Ltd.; MARKAO 60) were added as the antioxidants, and the components were dry blended by a Henschel mixer. The obtained blend was melt kneaded by a twin screw extruder while 43 parts by weight of glass fiber (a product of ASAHI FIBER GLASS Co., Ltd.; FT-712; 10 μm/3 mm) as component (f) was added by side feeding to obtain pellets. By using the obtained pellets, test pieces for the Izod impact test and the tensile test were prepared by the injection molding. The Izod impact strength and the tensile strength were measured by using the obtained test pieces. The color tone was evaluated by visual observation. The results are shown in Table 3.

EXAMPLE 18

The same procedures as those conducted in Example 17 were conducted except that PPO modified with fumaric acid which was obtained in Example 6 was used as component (e). The results are shown in Table 3.

COMPARATIVE EXAMPLES 22 AND 23

The same procedures as those conducted in Example 17 and 18 were conducted in Comparative Examples 22 and 23, respectively, except that materials shown in Table 3 were used as component (e). The results are shown in Table 3.

TABLE 3-1

| | formulation | | | | | |
|---|---|---|---|---|---|---|
| | (d) SPS mol. wt. | (d') rubber SEBS KURARAY | (d") polyamide PA66 UBE | (e) acid-modified PPO | | (f) inorganic filler glass fiber ASAHI FIBER |
| | 320,000 g | KL8006 g | PA2020B g | type — | amount g | GLASS FT712 g |
| Example 11 | 45 | 0 | 50 | Example 3 | 5 | 0 |
| Example 12 | 45 | 0 | 50 | Example 6 | 5 | 0 |
| Example 13 | 40 | 5 | 50 | Example 3 | 5 | 0 |
| Example 14 | 40 | 5 | 50 | Example 6 | 5 | 0 |

TABLE 3-1-continued

| | (d) SPS mol. wt. | (d') rubber SEBS KURARAY | (d") polyamide PA66 UBE | (e) acid-modified PPO | | (f) inorganic filler glass fiber ASAHI FIBER |
|---|---|---|---|---|---|---|
| | 320,000 g | KL8006 g | PA2020B g | type | amount g | GLASS FT712 g |
| Example 15 | 45 | 0 | 50 | Example 3 | 5 | 43 |
| Example 16 | 45 | 0 | 50 | Example 6 | 5 | 43 |
| Example 17 | 40 | 5 | 50 | Example 3 | 5 | 43 |
| Example 18 | 40 | 5 | 50 | Example 6 | 5 | 43 |
| Comparative Example 16 | 45 | 0 | 50 | Comparative Example 8 | 5 | 0 |
| Comparative Example 17 | 45 | 0 | 50 | Comparative Example 11 | 5 | 0 |
| Comparative Example 18 | 40 | 5 | 50 | Comparative Example 8 | 5 | 0 |
| Comparative Example 19 | 40 | 5 | 50 | Comparative Example 11 | 5 | 0 |
| Comparative Example 20 | 45 | 0 | 50 | Comparative Example 8 | 5 | 43 |
| Comparative Example 21 | 45 | 0 | 50 | Comparative Example 11 | 5 | 43 |
| Comparative Example 22 | 40 | 5 | 50 | Comparative Example 8 | 5 | 43 |
| Comparative Example 23 | 40 | 5 | 50 | Comparative Example 11 | 5 | 43 |

TABLE 3-2

| | results | | |
|---|---|---|---|
| | physical properties | | |
| | Izod impact strength method of JIS K-7110 with a notch (KJ/m$^2$) | tensile property elongation method of JIS K-7113 (%) | color tone 1 to 10 for good to poor |
| Example 11 | 2.9 | 3.1 | 1 |
| Example 12 | 3.3 | 4.0 | 2 |
| Example 13 | 8.7 | 20.1 | 2 |
| Example 14 | 9.8 | 28.3 | 3 |
| Example 15 | 8.8 | 2.2 | 3 |
| Example 16 | 9.9 | 2.8 | 4 |
| Example 17 | 10.4 | 2.9 | 4 |
| Example 18 | 11.5 | 3.5 | 5 |
| Comparative Example 16 | 2.0 | 2.0 | 6 |
| Comparative Example 17 | 2.5 | 2.9 | 7 |
| Comparative Example 18 | 7.0 | 14.8 | 7 |
| Comparative Example 19 | 8.4 | 20.0 | 8 |
| Comparative Example 20 | 7.8 | 2.0 | 8 |
| Comparative Example 21 | 8.9 | 2.5 | 9 |
| Comparative Example 22 | 9.5 | 2.5 | 9 |
| Comparative Example 23 | 10.7 | 2.9 | 10 |

As can be clearly understood from Table 3, by using PPO modified with fumaric acid which was obtained in accordance with the process of the present invention in the alloy or in the composite containing SPS, the compositions having superior toughness and color tone to those of the compositions using PPO modified with maleic acid to the same level of the degree of modification could be obtained.

INDUSTRIAL APPLICABILITY

In accordance with the present invention, the acid-modified polyphenylene ether can be produced without causing deterioration of the working environment and significant decrease in the molecular weight. The color tone can also be improved remarkably in comparison with that of conventional polyphenylene ethers modified with maleic acid. The polystyrenic resin composition of the present invention using PPO modified with fumaric acid which is obtained in accordance with the process of the present invention has an improved color tone and exhibits higher toughness in comparison with those of resin compositions using conventional PPO modified with maleic acid. Therefore, the polystyrenic resin composition of the present invention can advantageously be molded to prepare industrial materials, such as electric and electronic parts (connectors, printed boards, and the like), industrial structural materials, automotive parts (connectors for vehicles, wheel caps, cylinder head covers, and the like), electric appliances, various types of mechanical part, pipes, sheets, trays, films, and the like.

I claim:

1. A process for producing an acid-modified polyphenylene ether comprising conducting modification reaction substantially in the absence of solvents at 300 to 350° C. by using (a) 100 parts by weight of a polyphenylene ether, (b) 0.5 to 5.0 parts by weight of fumaric acid or a derivative of fumaric acid, and (c) 0.1 to 5.0 parts by weight of a radical generating agent having a half-life of 1 minute at a temperature of 300° C. or higher.

2. A process for producing an acid-modified polyphenylene ether according to claim 1 wherein the radical generating agent is 2,3-dimethyl-2,3-diphenylbutane.

3. The process of claim 1, wherein the polyphenylene ether is selected from the group consisting of poly(2,3- dimethyl-6-ethyl-1,4-phenylene ether), poly(2-methyl-6-chloromethyl-1,4-phenylene ether), poly(2-methyl-6-hydroxyethyl-1,4-phenylene ether), poly(2-methyl-6-n-butyl-1,4-phenylene ether), poly(2-ethyl-6-isopropyl-1,4-phenylene ether), poly(2-ethyl-6-n-propyl-1,4-phenylene ether), poly(2,3,6-trimethyl-1,4-phenylene ether), poly[2-(4'-methylphenyl)-1,4-phenylene ether], poly(2-bromo-6-phenyl-1,4-phenylene ether), poly(2-methyl-6-phenyl-1,4-phenylene ether), poly(2-phenyl-1,4-phenylene ether), poly(2-chloro-1,4-phenylene ether), poly(2-methyl-1,4-phenylene ether), poly(2-chloro-6-ethyl-1,4-phenylene ether), poly(2-chloro-6-bromo-1,4-phenylene ether), poly(2,6-di-n-propyl-1,4-phenylene ether), poly(2-methyl-6-isopropyl-1,4-phenylene ether), poly(2-chloro-6-methyl-1,4-phenylene ether), poly(2-methyl-6-ethyl-1,4-phenylene ether), poly(2,6-dibromo-1,4-phenylene ether), poly(2,6-dichloro-1,4-phenylene ether), poly(2,6-diethyl-1,4-phenylene ether), and poly(2,6-dimethyl-1,4-phenylene ether).

4. The process of claim 1, wherein the polyphenylene ether is poly(2,6-dimethyl-1,4-phenylene ether).

5. The process of claim 1, wherein the derivative of fumaric acid is selected from the group consisting of diesters of fumaric acid, metal salts of fumaric acid, ammonium salts of fumaric acid, and halides of fumaric acid.

6. The process of claim 1, wherein the radical generating agent is selected from the group consisting of 2,3-dimethyl-2,3-diphenylbutane, 2,3-diethyl-2,3-diphenylbutane, 2,3-diethyl-2,3-diphenylhexane, 2,3-diethyl-2,3-di(p-methylphenyl)butane.

7. A process for producing a polystyrenic resin composition, comprising:
producing an acid-modified polyphenylene ether according to claim 2; and
combining the acid-modified polyphenylene with a styrenic polymer having a syndiotactic configuration and an inorganic filler,
wherein the polystyrenic resin composition comprises:
0.05 to 5.0 parts by weight of the acid-modified polyphenylene;
100 parts by weight of the styrenic polymer having a syndiotactic configuration; and
0.5 to 350 parts by weight of the inorganic filler.

8. The process of claim 7, wherein the inorganic filler is a glass fiber treated on the surface thereof.

9. The process of claim 7, wherein the styrenic polymer is selected from the group consisting of a polystrene, a poly(alkylstyrene), a poly(halogenated styrene), a poly(halogenated alkyl styrene), a poly(alkoxystyrene), and a poly(vinyl benzoic acid ester).

10. The process of claim 7, where the styrenic polymer is selected from the group consisting of poly(chlorostyrene), poly(bromostyrene), poly(fluorostyrene), poly(chloromethylstyrene), poly(methoxystyrene), poly(ethoxystyrene), polystyrene, poly(p-methylstyrene), poly(m-methylstyrene), poly(p-tertiary-butylstyrene), poly(p-chlorostyrene), poly(m-chlorostyrene), poly(p-fluorostyrene), and hydrogenated polystyrene.

11. A process for producing a polystyrenic resin composition, comprising:
producing an acid-modified polyphenylene ether according to claim 1; and
combining the acid-modified polyphenylene with a styrenic resin having a syndiotactic configuration, a rubbery elastomer, and an inorganic filler,
wherein the polystyrenic resin composition comprises:
100 parts by weight of a component composed of 50.0 to 97.0% by weight of the styrenic resin having a syndiotactic configuration and 3.0 to 50.0% by weight of the rubbery elastomer;
0.5 to 5.0 parts by weight of the acid-modified polyphenylene ether; and
0.5 to 350 parts by weight of the inorganic filler.

12. The process of claim 11, wherein the inorganic filler is a glass fiber treated on the surface thereof.

13. The process of claim 11, wherein the styrenic polymer is selected from the group consisting of a polystrene, a poly(alkylstyrene), a poly(halogenated styrene), a poly(halogenated alkyl styrene), a poly(alkoxystyrene), and a poly(vinyl benzoic acid ester).

14. The process of claim 11, where the styrenic polymer is selected from the group consisting of poly(chlorostyrene), poly(bromostyrene), poly(fluorostyrene), poly(chloromethylstyrene), poly(methoxystyrene), poly(ethoxystyrene), polystyrene, poly(p-methylstyrene), poly(m-methylstyrene), poly(p-tertiary-butylstyrene), poly(p-chlorostyrene), poly(m-chlorostyrene), poly(p-fluorostyrene), and hydrogenated polystyrene.

15. The process of claim 14, wherein the rubbery elastomer is selected from the group consisting of natural rubber, polybutadiene, polyisoprene, polyisobutylene, neoprene, polysulfide rubber, thiokol rubber, acrylic rubber, urethane rubber, silicone rubber, epichlorohydrin rubber, styrene-butadiene block copolymers (SBR), hydrogenated styrene-butadiene block copolymers (SEB), styrene-butadiene-styrene block copolymers (SBS), hydrogenated styrene-butadiene-styrene block copolymers (SEBS), styrene-isoprene block copolymers (SIR), hydrogenated styrene-isoprene block copolymers (SEP), styrene-isoprene-styrene block copolymers (SIS), hydrogenated styrene-isoprene-styrene block copolymers (SEPS), styrene-butadiene random copolymers, hydrogenated styrene-butadiene random copolymers, styrene-ethylene-propylene random copolymers, styrene-ethylene-butylene random copolymers, ethylene-propylene rubber (EPR), ethylene-propylene-diene rubber (EPDM), core-shell type particulate elastomers, methyl methacrylate-butadiene-styrene core-shell rubber (MBS), methyl methacrylate-butyl acrylate-styrene core-shell rubber (MAS), octyl acrylate-butadiene-styrene core-shell rubber (MABS), an alkyl acrylate-butadiene-acrylonitrile-styrene core-shell rubber (AABS), butadiene-styrene core-shell rubber (SBR), and core-shell rubbers containing siloxane.

16. A process for producing a polystyrenic resin composition, comprising:
producing an acid-modified polyphenylene ether according to claim 1; and
combining the acid-modified polyphenylene with a styrenic resin having a syndiotactic configuration and a polyamide,
wherein the polystyrenic resin composition comprises:
100 parts by weight of a component composed of 10.0 to 90.0% by weight of the styrenic resin having a syndiotactic configuration and 10.0 to 90.0% by weight of the polyamide; and
0.5 to 10.0 parts by weight of the acid-modified polyphenylene ether.

17. The process of claim 16, wherein the styrenic polymer is selected from the group consisting of a polystrene, a poly(alkylstyrene), a poly(halogenated styrene), a poly(halogenated alkyl styrene), a poly(alkoxystyrene), and a poly(vinyl benzoic acid ester).

18. The process of claim 16, where the styrenic polymer is selected from the group consisting of poly(chlorostyrene), poly(bromostyrene), poly(fluorostyrene), poly(chloromethylstyrene), poly(methoxystyrene), poly(ethoxystyrene), polystyrene, poly(p-methylstyrene), poly(m-methylstyrene), poly(p-tertiary-butylstyrene), poly(p-chlorostyrene), poly(m-chlorostyrene), poly(p-fluorostyrene), and hydrogenated polystyrene.

19. A process for producing a polystyrenic resin composition, comprising:
producing an acid-modified polyphenylene ether according to claim 1; and
combining the acid-modified polyphenylene with a styrenic resin having a syndiotactic configuration, a rubbery elastomer, and a polyamide,
wherein the polystyrenic resin composition comprises:
100 parts by weight of a component composed of 9.0 to 90.0% by weight of the styrenic resin having a syndiotactic configuration, 1.0 to 50.0% by weight of the rubbery elastomer, and 9.0 to 90.0% by weight of the polyamide; and
0.5 to 10.0 parts by weight of the acid-modified polyphenylene ether.

20. The process of claim 19, wherein the styrenic polymer is selected from the group consisting of a polystrene, a poly(alkylstyrene), a poly(halogenated styrene), a polyhalogenated alkyl styrene), a poly(alkoxystyrene), and a poly-vinyl benzoic acid ester).

21. The process of claim 19, where the styrenic polymer is selected from the group consisting of poly(chlorostyrene), poly(bromos tyrene), poly(fluorostyrene), poly(chloromethylstyrene), poly(methoxystyrene), poly(ethoxystyrene), polystyrene, poly(p-methylstyrene), poly(m-methylstyrene), poly(p-tertiary-butylstyrene), poly(p-chlorostyrene), poly(m-chlorostyrene), poly(p-fluorostyrene), and hydrogenated polystyrene.

22. The process of claim 19, wherein the rubbery elastomer is selected from the group consisting of natural rubber, polybutadiene, polyisoprene, polyisobutylene, neoprene, polysulfide rubber, thiokol rubber, acrylic robber, urethane rubber, silicone rubber, epichlorohydrin rubber, styrene-butadiene b ock copolymers (SBR), hydrogenated styrene-butadiene block copolymers (SEB), styrene-butadiene-styrene block copolymers (SBS), hydrogenated styrene-butadiene-styrene block copolyme rs (SEBS), styrene-isoprene block copolymers (SIR), hydrogenated styrene-isoprene block copolymers (SEP), styrene-isoprene-styrene block copolymers (SIS), hydrogenated styrene-isoprene-styrene block copolymers (SEPS), styrene-butadiene random copolymers, hydrogenated styrene-butadiene random copolymers, styrene-ethylene-propylene random copolymers, styrene-ethylene-butylene random copolymers, ethylene-propylene rubber (EPR), ethylene-propylene-diene rubber (EPDM), core-shell type particulate elastomers, methyl methacrylate-butadiene-styrene core-shell rubber (MBS), methyl methacrylate-butyl acrylate-styrene core-shell rubber (MAS), octyl acrylate-butadiene-styrene core-shell rubber (MABS), an alkyl acrylate-butadiene-acrylonitrile-styrene core-shell rubber (AABS), butadiene-styrene core-shell rubber (SBR), and core-shell rubbers containing siloxane.

23. A process for producing a polystyrenic resin composition, comprising:
producing an acid-modified polyphenylene ether according to claim 2; and
combining the acid-modified polyphenylene with a styrenic resin having a syndiotactic configuration, a polyamide, and an inorganic filler,
wherein the polystyrenic resin composition comprises:
100 parts by weight of a component composed of 10.0 to 90.0% by weight of the styrenic resin having a syndiotactic configuration and 10.0 to 90.0% by weight of the polyamide; and
0.5 to 10.0 parts by weight of the acid-modified polyphenylene ether; and
0.5 to 350 parts by weight of the inorganic filler.

24. The process of claim 23, wherein the inorganic filler is a glass fiber treated on the surface thereof.

25. The process of claim 23, wherein the styrenic polymer is selected from the group consisting of a polystrene, a poly(alkylstyrene), a poly(halogenated styrene), a poly(halogenated alkyl styrene), a poly(alkoxystyrene), and a poly(vinyl benzoic acid ester).

26. The process of claim 23, where the styrenic polymer is selected from the group consisting of poly(chlorostyrene), poly(bromostyrene), poly(fluorostyrene), poly(chloromethylstyrene), poly(methoxystyrene), poly(ethoxystyrene), polystyrene, poly(p-methylstyrene), poly(m-methylstyrene), poly(p-tertiary-butylstyrene), poly(p-chlorostyrene), poly(m-chlorostyrene), poly(p-fluorostyrene), and hydrogenated polystyrene.

27. A process for producing a polystyrenic resin composition, comprising:
producing an acid-modified polyphenylene ether according to claim 1; and
combining the acid-modified polyphenylene with a styrenic resin having a syndiotactic configuration, a rubbery elastomer, a polyamide, and an inorganic filler,
wherein the polystyrenic resin composition comprises:
100 parts by weight of a component composed of 10.0 to 90.0% by weight of the styrenic resin having a syndiotactic configuration, 1.0 to 50.0% by weight of the rubbery elastomer, and 9.0 to 90.0% by weight of a polyamide;
0.5 to 10.0 parts by weight of the acid-modified polyphenylene ether; and
0.5 to 350 parts by weight of inorganic filler.

28. The process of claim 27, wherein the inorganic filler is a glass fiber treated on the surface thereof.

29. The process of claim 27, wherein the styrenic polymer is selected from the group consisting of a polystrene, a poly(alkylstyrene), a poly(halogenated styrene), a poly(halogenated alkyl styrene), a poly(alkoxystyrene), and a poly(vinyl benzoic acid ester).

30. The process of claim 27, where the styrenic polymer is selected from the group consisting of poly(chlorostyrene), poly(bromostyrene), poly(fluorostyrene), poly(chloromethylstyrene), poly(methoxystyrene), poly(ethoxystyrene), polystyrene, poly(p-methylstyrene), poly(m-methylstyrene), poly(p-tertiary-butylstyrene), poly(p-chlorostyrene), poly(m-chlorostyrene), poly(p-fluorostyrene), and hydrogenated polystyrene.

31. The process of claim 27, wherein the rubbery elastomer is selected from the group consisting of natural rubber, polybutadiene, polyisoprene, polyisobutylene, neoprene, polysulfide rubber, thiokol rubber, acrylic rubber, urethane rubber, silicone rubber, epichlorohydrin rubber, styrene-butadiene block copolymers (SBR), hydrogenated styrene-butadiene block copolymers (SEB), styrene-butadiene-styrene block copolymers (SBS), hydrogenated styrene-butadiene-styrene block copolymers (SEBS), styrene-isoprene block copolymers (SIR), hydrogenated styrene-isoprene block copolymers (SEP), styrene-isoprene-styrene block copolymers (SIS), hydrogenated styrene-isoprenestyrene block copolymers (SEPS), styrene-butadiene random copolymers, hydrogenated styrene-butadiene random copolymers, styrene-ethylene-propylene random copolymers, styrene-ethylene-butylene random copolymers, ethylene-propylene rubber (EPR), ethylene-propylene-diene rubber (EPDM), core-shell type particulate elastomers, methyl methacrylate-butadiene-styrene core-shell rubber (MBS), methyl methacrylate-butyl acrylate-styrene core-shell rubber (MAS), octyl acrylate-butadiene-styrene core-shell rubber (MABS), an alkyl acrylate-butadiene-acrylonitrile-styrene core-shell rubber (AABS), butadiene-styrene core-shell rubber (SBR), and core-shell rubbers containing siloxane.

32. A process for producing a polystyrenic resin composition, comprising:

producing an acid-modified polyphenylene ether according to claim 1; and combining the acid-modified polyphenylene with a styrenic polymer having a syndiotactic configuration.

33. A process for producing a polystyrenic resin composition, comprising:

producing an acid-modified polyphenylene ether according to claim 1; and combining the acid-modified polyphenylene with a styrenic polymer having a syndiotactic configuration and an inorganic filler.

34. A process for producing a polystyrenic resin composition, comprising:

producing an acid-modified polyphenylene ether according to claim 1; and combining the acid-modified polyphenylene with a styrenic resin having a syndiotactic configuration, a rubbery elastomer, and an inorganic filler.

35. A process for producing a polystyrenic resin composition, comprising:

producing an acid-modified polyphenylene ether according to claim 1; and combining the acid-modified polyphenylene with a styrenic resin having a syndiotactic configuration and a polyamide.

36. A process for producing a polystyrenic resin composition, comprising:

producing an acid-modified polyphenylene ether according to claim 1; and combining the acid-modified polyphenylene with a styrenic resin having a syndiotactic configuration, a rubbery elastomer, and a polyamide.

37. A process for producing a polystyrenic resin composition, comprising:

producing an acid-modified polyphenylene ether according to claim 1; and combining the acid-modified polyphenylene with a styrenic resin having a syndiotactic configuration, a polyamide, and an inorganic filler.

* * * * *